United States Patent [19]
Kalous

[11] 3,937,352
[45] Feb. 10, 1976

[54] PLURAL COVER MOUNTING ARRANGEMENT
[75] Inventor: Leo R. Kalous, Cedar Rapids, Iowa
[73] Assignee: Rockwell International Corporation, El Segundo, Calif.
[22] Filed: July 24, 1975
[21] Appl. No.: 598,903

[52] U.S. Cl.............. 220/3.94; 220/327; 220/4 E
[51] Int. Cl.² ................................. H02G 3/08
[58] Field of Search............ 220/3.94, 3.2, 3.8, 4 R, 220/4 B, 4 E, 327

[56] References Cited
UNITED STATES PATENTS
3,166,633   1/1965   Gazan, Jr. et al............... 220/3.8 X
3,734,342   5/1973   Patterson...................... 220/327 X Primary Examiner—William Price
Assistant Examiner—Steven M. Pollard
Attorney, Agent, or Firm—Howard R. Greenberg; Robert J. Crawford

[57] ABSTRACT

An arrangement for mounting plural covers on opposite surfaces of one or more planes employs elongated fastening nuts for receiving mounting bolts from opposite directions via the cover tops, formed with a pair of grooves which permits each nut to mate with a notch in a wall of one of the covers so that its rotational movement is restrained while housed therein.

4 Claims, 4 Drawing Figures

PLURAL COVER MOUNTING ARRANGEMENT

BACKGROUND OF THE INVENTION

The present invention pertains generally to covers such as shielding cans which are mounted on printed or etched circuit boards to isolate the electronic components thereunder from undesired interfering signals and specifically to an arrangement for conveniently and facilely mounting plural covers on the opposite surfaces of one or more planes.

As is well known, quite often metallic covers are placed over sensitive electronic components comprising a circuit board to provide shielding from undesired signals which might otherwise interfere with and degrade the circuit operation. With the continual striving for equipment miniaturization, comes a need to conserve as much space under the shielding cover as is practicable for accommodating electronic components which are more and more congested into smaller and smaller areas. Thus, whereas previously columns or posts formed separately or integrally with the shielding cover for providing a passageway to the mounting bolts which affix the cover to the board and/or positioning of the bolts irrespective of effective space utilization may have been unimportant considerations, the continuing reduction in space allocation for components warrants greater attention than heretofore in how the cover is to be affixed when mounted.

With the wide acceptance and copious utilization of circuit boards also comes a need for facilitating their testing when necessary, which in the case of shielding cans engenders mounting and removability convenience to afford ease of access to the circuit board components. Although such a concern may seem superficial and even trivial, it must be borne in mind that the number of boards to be tested during the course of some operation such as product assembly or subsequent troubleshooting may be considerable running into the hundreds or thousands. Consequently, even a few seconds savings in emplacing or removing a shielding can to access the components thereunder may generate substantial time and cost savings in required manpower. As may well be appreciated, the foregoing problems of space conservation under shielding cans and the ease with which they are mounted and removed, are greatly magnified when plural cans must be used for shielding opposite surfaces of one or more circuit boards used in combination.

Consequently, with the foregoing in mind, it is a primary object of the present invention to provide a new and improved arrangement for mounting plural covers on the opposite surfaces of one or more planes.

It is a further object of the present invention to provide such an arrangement which minimally detracts from the allotted space under the covers while affording a great degree of flexibility and convenience in mounting and removing the covers to access the components thereunder.

These, as well as other objects and the means by which they are achieved through the present invention, may best be appreciated by referring to the Detailed Description of the Invention which follows hereinafter together with the appended drawings.

BRIEF DESCRIPTION OF THE INVENTION

In accordance with the stated objects, the subject invention employs elongated fastening nuts for receiving mounting bolts from opposite directions via the tops of oppositely mounted covers, each nut having a pair of grooves along its long axis for mating with a notch in the wall of one of the covers so that while housed its rotational movement is restrained to facilitate the removal of one bolt without dislodging the other. Positioning the fastening nuts in the cover wall minimizes the amount of space which must be allocated for accommodating the mounting bolts, thereby detracting as little as possible from the space under the covers available for housing components.

In a first embodiment described, wherein a pair of covers is used in conjunction with a single plane, the cover housing the fastening nuts slideably engages the grooves thereof upon mating so that it can be removed to access the components thereunder by removing its associated bolts while leaving the other cover in place (together with the fastening nuts) or alternatively both covers can be removed simultaneously by merely removing the mounting bolts of the other cover which then releases the fastening nuts while still mated with the cover housing them. In a second embodiment described, wherein three covers are used in combination with two parallel planes, the fastening nuts are housed in the inner cover located intermediate the two planes. Either of the two outer covers may then be removed by removing its associated mounting bolts while leaving the other outer cover in place (together with the inner cover) or alternatively all three covers can be removed simultaneously by removing all of the mounting bolts.

DETAILED DESCRIPTION OF THE INVENTION

Figure 1:
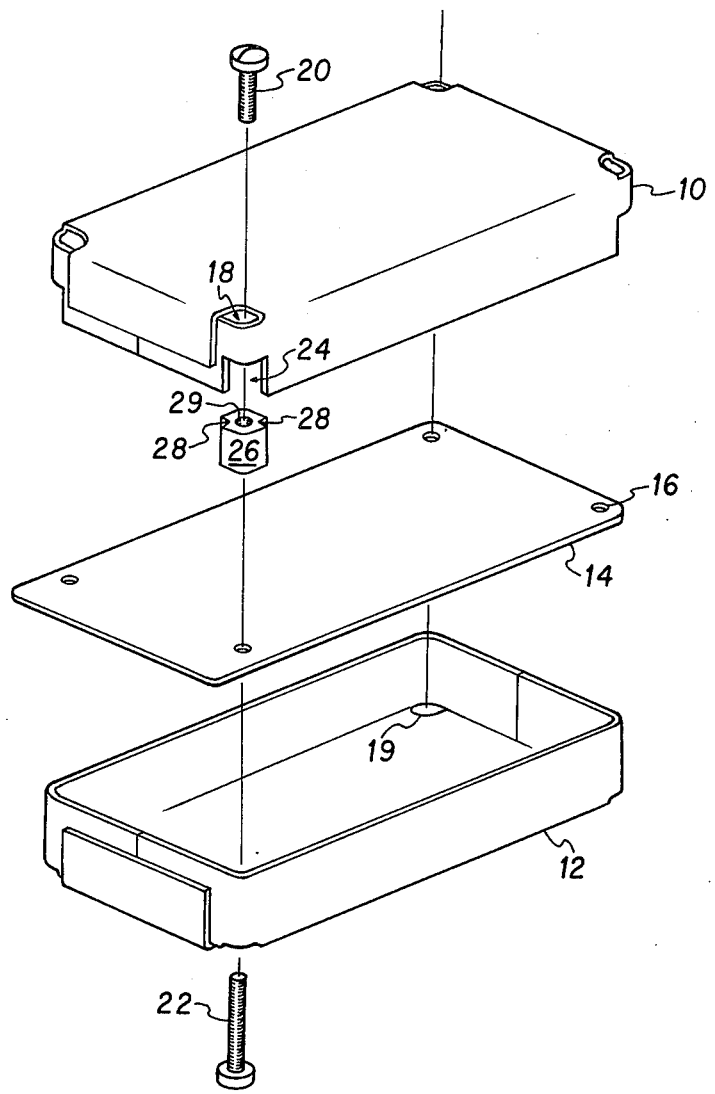
FIG. 1 is an isometric view of the first embodiment of the invention employing two covers and a single plane, depicting all components aligned in normal juxtaposition just prior to assembly.
Figure 2:
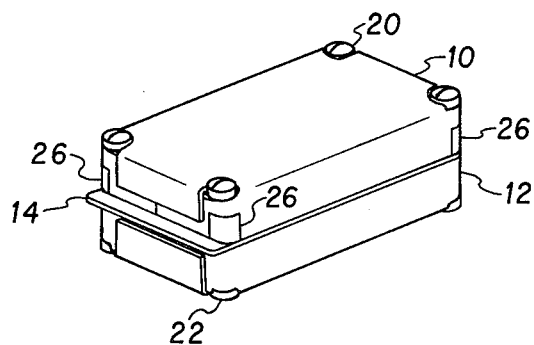
FIG. 2 is an isometric view of the assembled embodiment of FIG. 1.

As shown in FIGS. 1 and 2, two covers 10 and 12 each have a top and side wall for defining a completely enclosed space thereunder when mounted on opposite surfaces of a plane 14 such as a circuit board. Although the covers 10 and 12 are shown as being formed from sheet metal, it will be readily apparent that any desired manufacturing process such as casting can just as well be used to suit individual needs. Plane 14 contains apertures 16 which align with apertures 18 located in the top of cover 10 adjacent its wall when cover 10 is mounted in place as well as with like apertures 19 in the top of cover 12 when likewise mounted in place. It is to be realized that apertures 18 and 19 in the top of covers 10 and 12, respectively, preferably extend to the walls to allow their respective mounting bolts 20 and 22 a cornermost position to minimally detract from the space located under the covers 10 and 12 for housing components. Although the bolt heads are shown recessed in the cover tops and bear down directly on the cover walls when in place, this is not essential so long as the apertures are adjacent the wall, even if not extended thereto, in order to position the mounting bolts 20 and 22 as close to the cover walls as desired to conserve on space under the covers 10 and 12 available for housing components.

In each wall corner of cover 10, below aperture 18, is located a notch 24 which is designed to slideably engage an elongated fastening nut 26 having grooves 28 along the long axes thereof for mating purposes. The contour of fastening nut 26 preferably conforms to that of the wall of cover 10 so that when mated with notch 24 no interruptions in the cover surface are perceptible. Along its long axis, each fastening nut 26 has a threaded shaft 29 which aligns with an aperture 16, 18 and 19 so that mounting bolts 20 and 22 can be threaded thereinto from opposite directions, each mounting bolt 20 via an aperture 18 and each mounting bolt 22 via an aperture 16 and 19. The length of bolts 20 and 22 are such that neither interferes with the travel of the other when screwed into place.

It should be noted that grooves 28 bear against the sides of notch 24 so that when mated therewith the rotational movement of each fastening nut 26 is restrained. This insures that the turning of one of the bolts affects only that bolt and does not affect the other one such as dislodging it from the common fastening nut 26. Once the covers 10 and 12 are mounted in place, in order to access components under cover 10 one need only remove mounting bolts 20; cover 12 and fastening nuts 26 remain in place. On the other hand, by removing mounting bolts 22 only, the components under both covers 10 and 12 can be accessed simultaneously since cover 10 can then be removed with the fastening nuts 26 still mated with notches 24. It is to be noted that although the rectangular shape of cover 10 renders the wall corners thereof as natural locations for notches 24, anywhere in the side wall will suffice. Also, it is desirable that the height of notches 24 be slightly greater than the length of fastening nuts 26 to ensure that the bottom of the side wall of cover 10 makes good contact with the surface of plane 14 when used for shielding purposes. Further, although four bolts would normally be used for efficaciously affixing each cover to the plane 14, it will be realized that really only two at a minimum are required.

Figure 3:
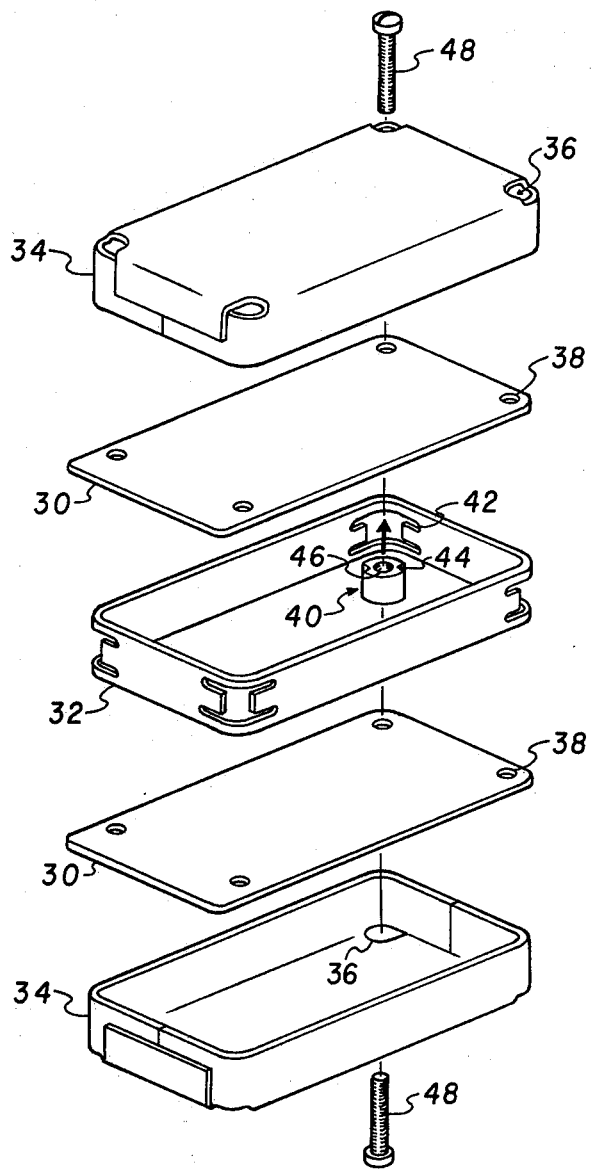
FIG. 3 is an isometric view of the second embodiment of the invention employing three covers used in connection with two parallel planes depicting all components aligned in normal juxtaposition just prior to assembly.
Figure 4:
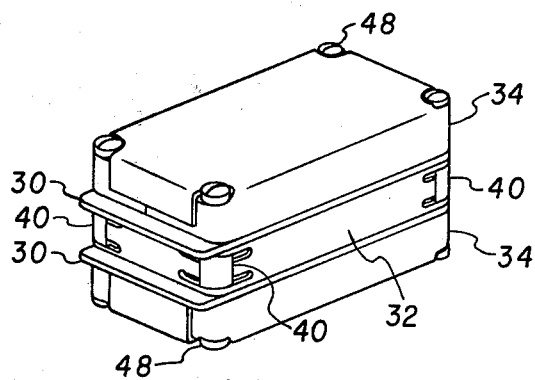
FIG. 4 is an isometric view of the assembled embodiment of FIG. 3.

FIGS. 3 and 4 show a second embodiment of the invention wherein three covers are used in conjunction with two parallel planes 30. Inner cover 32 which is located intermediate the two planes 30, may comprise merely a side wall for defining a completely enclosed space when mounted or if it is desired to isolate the components on the inner surface of one plane 30 from the other, inner cover 32 could be formed with a shielding plane parallel to planes 30 at any desired level contiguous with its wall. Outer covers 34 for mounting on the outer surfaces of planes 30, each have a top and side wall for defining a completely enclosed space when mounted in place with apertures 36 located in their tops adjacent their respective wall which align with apertures 38 located in planes 30 when so mounted.

Although elongated fastening nuts 40 could be made to slideably engage notches in inner cover 32 as in the first described embodiment, it is preferable to afford engagement by pressing the fastening nuts 40 into notches 42 of the wall of cover 32 from inside the cover 32, by deflecting the resilient sides of the notches 42, allowing them to snap in place, into grooves 44. Using a notch 42 which does not extend to the edge of the wall of inner cover 32 affords greater structural strength and as will be seen shortly permits greater convenience and flexibility by permitting either one of the outer covers 34 to be removed while leaving the other one in place.

Each fastening nut 40 has a threaded shaft 46 along its long axis which aligns with an aperture 38 of each plane 30 once in place. Accordingly, each outer cover 34 is affixed to its respective plane 30 by passing a mounting bolt 48 through an aperture 36 in its top and an aperture 38 in its associated plane 30 into the threaded shaft 46 of fastening nut 40. Fastening nut 40 is restrained from rotational movement by its mating with notch 42 and thus provides a means for affixing each of the outer covers 34 to the associated plane 30 independent of the other one. Of course, the length of bolts 36 are such that one does not interfere with the travel of the other when tightened into place in threaded shaft 46. As may now be appreciated, either cover 34 can be removed to access components thereunder without disturbing the rest of the assembly by removing its associated mounting bolts 48 or all three covers can be removed simultaneously by removing all of the mounting bolts 48.

As delineated by the foregoing, the subject invention is seen to provide a plural cover mounting arrangement which affords space conservation as well as convenience and flexibility in removing covers for access to components thereunder. Since modifications to the described embodiments which do not impinge on the scope and spirit of the invention will no doubt be evident to those skilled in the art, the foregoing detailed description is intended to be merely exemplary and not restrictive of the invention which will now be claimed hereinbelow.

What is claimed is:

1. An arrangement for mounting two covers on opposite surfaces of a plane, comprising:
    a first cover having a top and a side wall for defining a completely enclosed space when mounted on one of the surfaces of the plane, said top having at least two apertures adjacent said wall which align with apertures in the plane when mounted;
    at least two elongated fastening nuts, each having a threaded shaft and a pair of grooves along its long axis;
    at least two bolts for affixing said first cover to the plane by engaging the threaded shafts of said fastening nuts via the aligned apertures of said top and the plane;
    a second cover having a top and a side wall for defining a completely enclosed space when mounted on the other surface of the plane, its top having at least two apertures adjacent its wall which align with the apertures in the plane when mounted and its wall containing at least two notches below the apertures for mating with said fastening nuts by slideably engaging the grooves, and
    at least two more bolts for affixing said second cover to the plane by engaging the threaded shafts of said fastening nuts via the apertures in the top of said second cover.

2. The arrangement of claim 1 wherein said first cover has a rectangular shape and said notches are located in the wall corners thereof.

3. An arrangement for mounting plural covers on the surfaces of two parallel planes, comprising:

at least two elongated fastening nuts, each having a threaded shaft and a pair of grooves along its long axis;

a first cover having a side wall for defining a completely enclosed space when mounted between the inner surfaces of the two planes, said cover having at least two notches in its side wall for mating with said fastening nuts by engaging said grooves so that their threaded shafts align with apertures in the planes upon mounting;

a second cover having a top and a side wall for defining a completely enclosed space when mounted on the outer surface of one of the two planes, its top having at least two apertures adjacent its wall which align with the apertures in the planes when mounted;

at least two bolts for affixing said second cover to one of the two planes by engaging the threaded shafts of said fastening nuts via the aligned apertures thereof;

a third cover having a top and a side wall for defining a completely enclosed space when mounted on the outer surface of the other of the two planes, its top having at least two apertures adjacent its wall which align with the apertures in the planes when mounted, and at least two more bolts for affixing said third cover to the other plane by engaging the threaded shafts of said fastening nuts via the aligned apertures thereof.

4. The arrangement of claim 3 wherein said notches do not extend to either edge of the wall of said first cover and said fastening nuts are pressed into place upon mating therewith.

* * * * *